(12) United States Patent
Sato

(10) Patent No.: US 8,706,315 B2
(45) Date of Patent: Apr. 22, 2014

(54) COOLING CONTROLLING APPARATUS, ELECTRONIC APPARATUS, AND COOLING CONTROLLING METHOD

(75) Inventor: Yoichi Sato, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 353 days.

(21) Appl. No.: 13/005,145

(22) Filed: Jan. 12, 2011

(65) Prior Publication Data

US 2011/0176275 A1    Jul. 21, 2011

(30) Foreign Application Priority Data

Jan. 20, 2010 (JP) ................................ 2010-010167

(51) Int. Cl.
*G05D 23/00*    (2006.01)

(52) U.S. Cl.
USPC ........................................................ 700/300

(58) Field of Classification Search
USPC ........................................................ 700/300
See application file for complete search history.

(56) References Cited

U.S. PATENT DOCUMENTS

| | | | |
|---|---|---|---|
| 5,102,040 A | | 4/1992 | Harvey |
| 6,134,667 A * | | 10/2000 | Suzuki et al. ................ 713/300 |
| 6,285,150 B1 | | 9/2001 | Adam et al. |
| 6,390,379 B1 | | 5/2002 | Huang |
| 7,987,024 B2 * | | 7/2011 | Tunks et al. ................ 700/299 |
| 8,166,770 B2 | | 5/2012 | Suzuki et al. |
| 8,265,799 B2 * | | 9/2012 | Eto ............................... 700/300 |
| 2003/0216882 A1 * | | 11/2003 | Lai et al. ...................... 702/132 |
| 2004/0054938 A1 * | | 3/2004 | Belady et al. ................ 713/300 |
| 2005/0103873 A1 | | 5/2005 | Cheng |
| 2007/0047199 A1 * | | 3/2007 | Tsutsui ......................... 361/687 |
| 2007/0098374 A1 | | 5/2007 | Fujiwara |
| 2008/0080132 A1 | | 4/2008 | Kurosu et al. |
| 2008/0304229 A1 | | 12/2008 | June et al. |
| 2009/0249862 A1 * | | 10/2009 | Glover et al. ............... 73/30.04 |
| 2009/0256512 A1 * | | 10/2009 | Begun et al. ................. 318/471 |

FOREIGN PATENT DOCUMENTS

| | | |
|---|---|---|
| CN | 1704865 A | 12/2005 |
| CN | 101158879 A | 4/2008 |
| CN | 101530017 A | 9/2009 |
| JP | 8-22345 A | 1/1996 |
| JP | 2001-042952 A | 2/2001 |
| JP | 2007-060835 A | 3/2007 |
| JP | 4157550 B | 3/2007 |
| JP | 2007-124853 A | 5/2007 |

(Continued)

OTHER PUBLICATIONS

European Search Report dated Dec. 7, 2011 for corresponding European Application No. 11150510.3.
Korean Office Action mailed Jul. 20, 2012 for corresponding Korean Application No. 10-2011-0004842.
Chinese Office Action mailed Sep. 5, 2012 for corresponding Chinese Application No. 201110026073.4, with English-language Translation.

(Continued)

*Primary Examiner* — Sean P. Shechtman
*Assistant Examiner* — Steven Garland
(74) *Attorney, Agent, or Firm* — Fujitsu Patent Center

(57) ABSTRACT

A cooling controlling apparatus that cools an electronic apparatus includes a cooling fan that discharges air in an inside of the electronic apparatus to an outside of the electronic apparatus; an intake air temperature detector that detects a temperature of air taken into the electronic apparatus by the cooling fan; a part temperature detector that detects a temperature of an electronic part arranged inside the electronic apparatus; and a fan controller that controls a rotation number of the cooling fan based on the detected temperature of the electronic part and the detected intake air temperature.

17 Claims, 14 Drawing Sheets

(56) References Cited

FOREIGN PATENT DOCUMENTS

| JP | 2008-172118 A | 7/2008 |
| KR | 10-1997-0701833 A | 4/1997 |
| KR | 10-2006-0093373 A | 8/2006 |
| KR | 10-2009-0075120 A | 7/2009 |

OTHER PUBLICATIONS

Japanese Office Action mailed Sep. 3, 2013 for corresponding Japanese Application No. 2010-010167, with Partial English-language Translation.

* cited by examiner

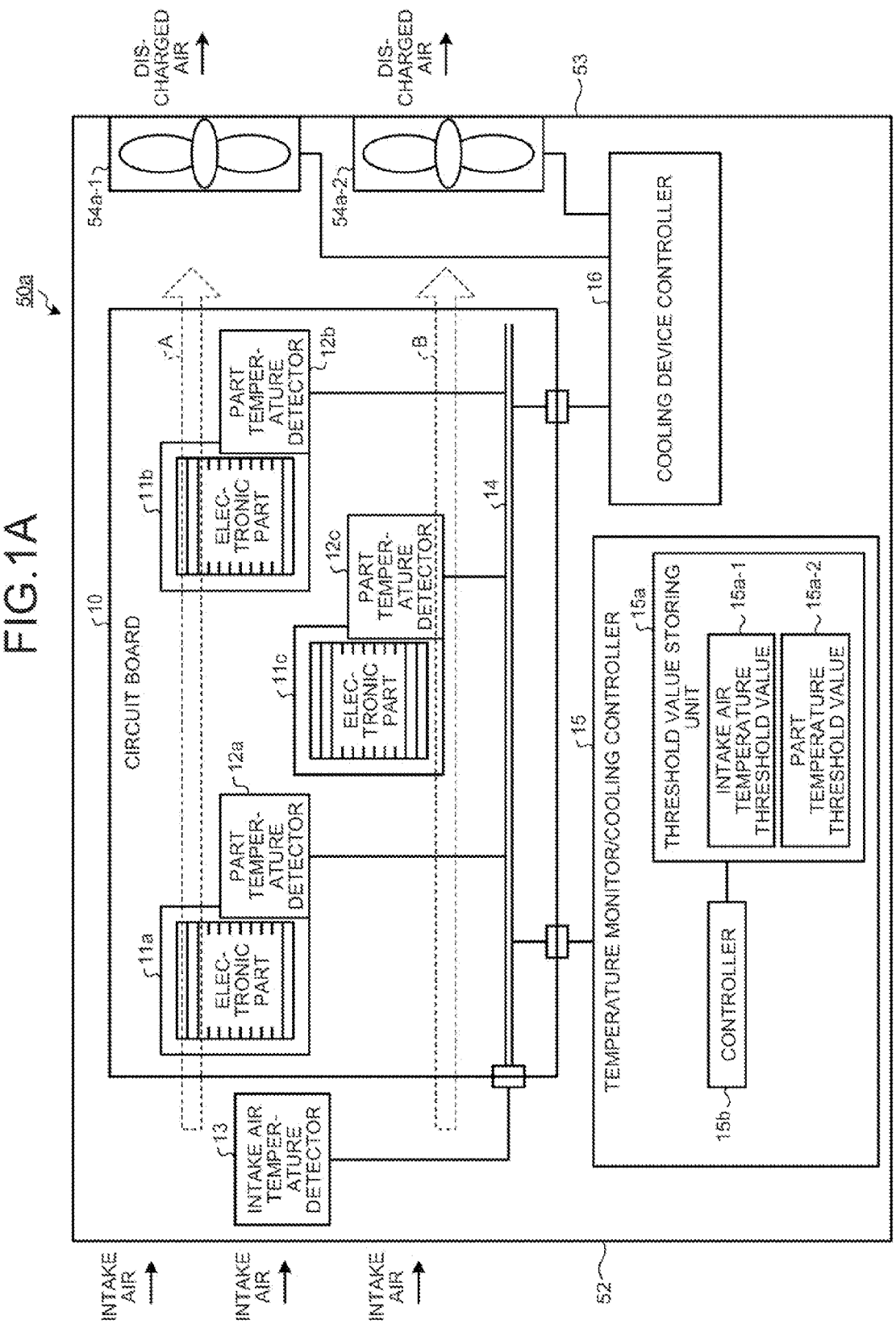

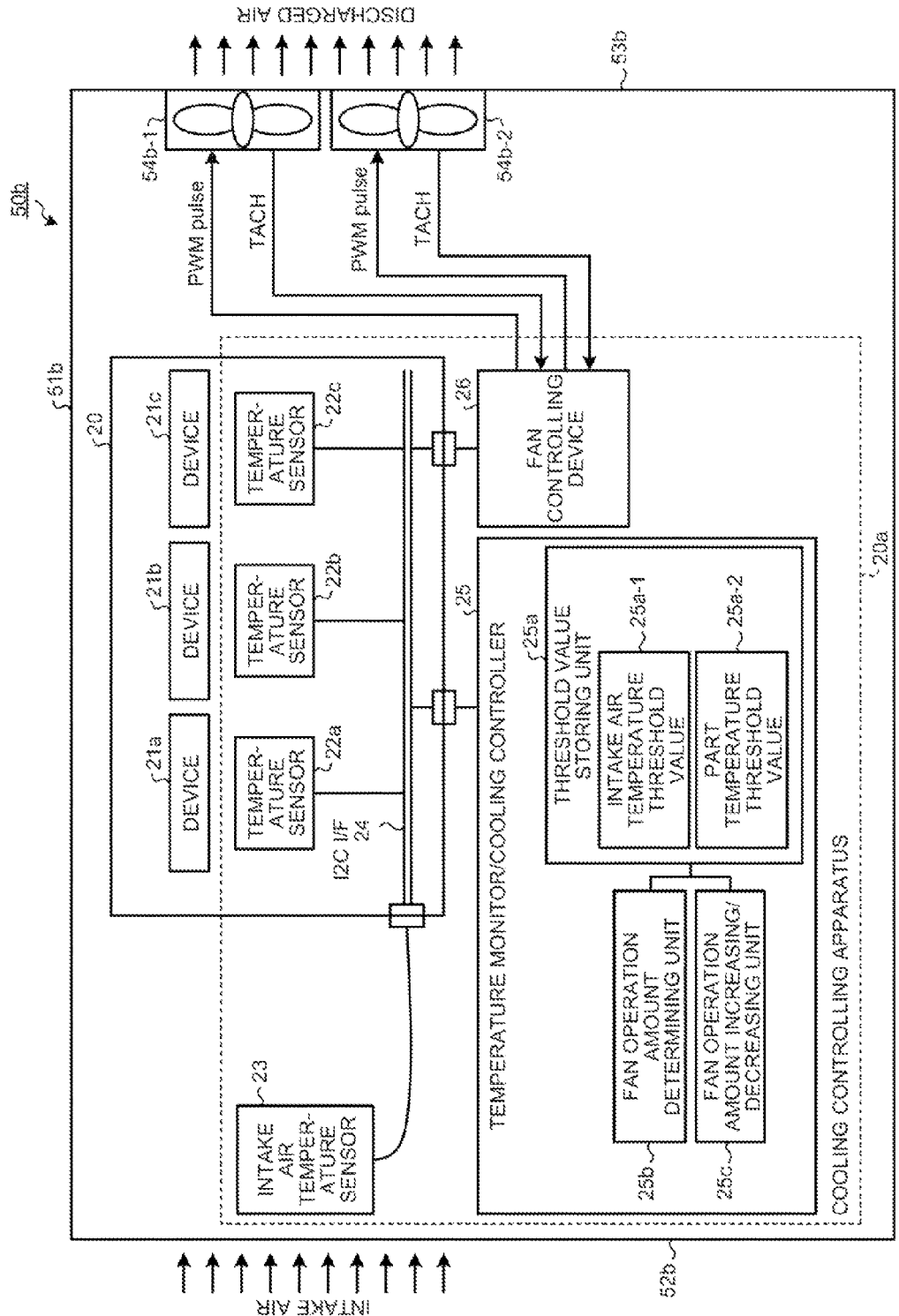

FIG.3A

|  | INTAKE AIR TEMPERATURE |
|---|---|
| THRESHOLD VALUE 3 | 35 °C |
| THRESHOLD VALUE 2 | 30 °C |
| THRESHOLD VALUE 1 | 25 °C |

FIG.3B

|  | DEVICE 21a | DEVICE 21b | DEVICE 21c |
|---|---|---|---|
| THRESHOLD VALUE 4 | 80 °C | 85 °C | 85 °C |
| THRESHOLD VALUE 3 | 70 °C | 75 °C | 65 °C |
| THRESHOLD VALUE 2 | 55 °C | 55 °C | 50 °C |
| THRESHOLD VALUE 1 | 30 °C | 30 °C | 25 °C |

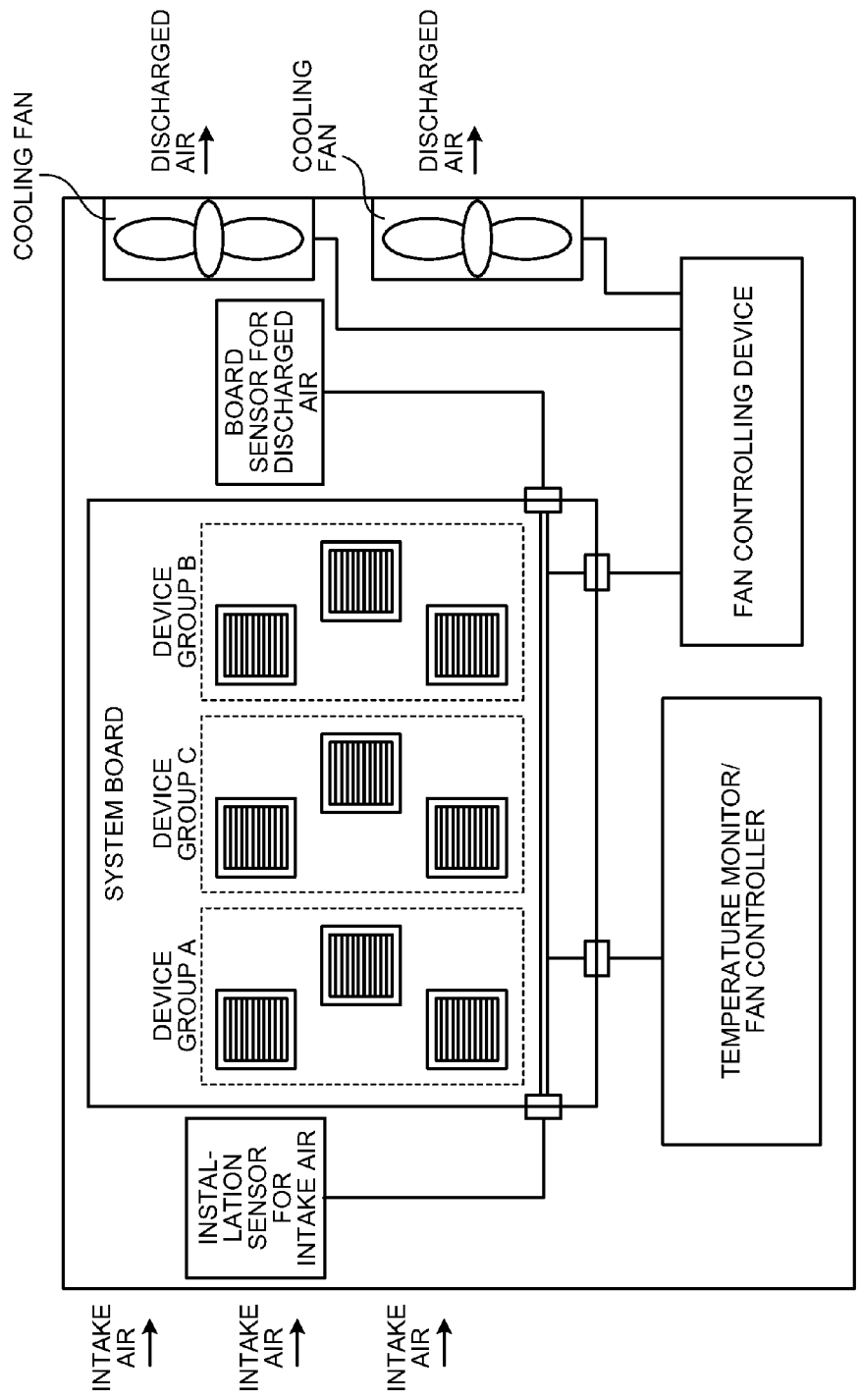

COOLING CONTROLLING APPARATUS, ELECTRONIC APPARATUS, AND COOLING CONTROLLING METHOD

CROSS-REFERENCE TO RELATED APPLICATION

This application is based upon and claims the benefit of priority from Japanese Patent Application No. 2010-010167, filed on Jan. 20, 2010, the entire contents of which are incorporated herein by reference.

FIELD

The embodiments discussed herein are directed to a cooling controlling apparatus, an electronic apparatus, and a cooling controlling method.

BACKGROUND

Conventionally, a temperature of a heat generating device such as a central processing unit (CPU) mounted on a motherboard is monitored by a control unit and the number of rotation of a device-specific fan or a cooling fan which cools an entire system is controlled so that the temperature of the device is adjusted at a target temperature in a personal computer and the like.

FIG. 8A is a perspective view of an example of a configuration of a conventional personal computer and FIG. 8B is a block diagram of the configuration of the personal computer illustrated in FIG. 8A. As illustrated in FIGS. 8A and 8B, a CPU-specific heatsink to which a fan is attached is adhered to a CPU which is a heat generating part mounted on a system board in this personal computer. In the fan-attached heatsink, a temperature sensor dedicated to the CPU is provided. Besides, a cooling fan for discharging, while taking in air in an outside of the housing, air in an inside of the housing is provided in a housing of the personal computer.

Then, a temperature monitor/fan controller selects a most suitable cooling measure to make a noise level appropriate by causing the temperature sensor to detect the temperature of the CPU and controlling the number of rotation of the fan-attached heatsink and the number of rotation of the cooling fan so that the temperature of the CPU is equal to or less than the target temperature. Specifically, the temperature monitor/fan controller increases the number of rotation of the fan-attached heatsink and the number of rotation of the cooling fan when the temperature of the CPU goes up and decreases the number of rotation of the fan-attached heatsink and the number of rotation of the cooling fan when the temperature of the CPU goes down as illustrated in FIG. 8C. By this, the temperature of the CPU is controlled to be within a set range for the target temperature. In this manner, the personal computer is configured to directly control and cool the CPU which is a heat generating parts by the fan-attached heatsink.

In contrast, a server installation as an information processing apparatus in which a lot of heat generating parts are mounted on a circuit board in high density is not provided with a fan-attached heatsink directly on a heat generating parts but usually configured to perform a cooling depending on a cooling fan provided in a housing.

FIG. 9A is a perspective view illustrating an example of a configuration of a conventional server installation and FIG. 9B is a block diagram of the configuration of the server installation illustrated in FIG. 9A. As illustrated in FIGS. 9A and 9B, the server installation is provided with two cooling fans in parallel for avoiding an operation stop due to a failure of a cooling fan. These cooling fans are provided at positions fronting onto an outside of the installation to make an exchange of the cooling fans easy.

In the server installation, however, the fan-attached heatsink adopted in a personal computer is not adopted. This is because the adhesion of the fan-attached heatsink to each of the numerous heat generating parts mounted on the circuit board in high density is not practical from a standpoint of space, control, and electric power consumption.

Therefore, the number of rotation of a cooling fan is controlled depending on a temperature of air taken in the inside of the housing in the server installation. For example, the number of rotation of the cooling fan is controlled to be "LOW SPEED" when the temperature of intake air is less than L1 [° C.] as illustrated in FIG. 9C. When the temperature of the intake is equal to or more than the L1 [° C.] and is less than L2 [° C.], the number of rotation of the cooling fan is controlled to be "MIDDLE SPEED". When the temperature of the intake air is equal to or more than the L2 [° C.] and is less than L3 [° C.], the number of rotation of the cooling fan is controlled to be "HIGH SPEED". Besides, when the temperature of the intake air becomes more than control range degree C., the installation itself is stopped to avoid a runaway effect of the server installation. More detailed information can be obtained in Japanese Laid-open Patent Publication No. 2001-42952, Japanese Laid-open Patent Publication No. 2007-60835, and Japanese Patent No. 4157550.

However, since the number of rotation of the cooling fan is controlled depending only on the temperature of the intake air into the housing in the conventional server installation as described above, the number of rotation of the cooling fan is constant at any time when the temperature of the intake air does not change. Therefore, the number of rotation of the cooling fan needs to be set on the assumption of a situation of each heat generating part operating at its maximum so that a temperature of each heat generating part will not exceed a limit value, thereby inevitably resulting in an excessive cooling as the matter stands now.

The excessive cooling performed on the assumption of the maximum operation despite no increase in temperature of each heat generating part in this manner causes problems of an increase in an electric power consumption and a noise both associated with the rotation of the cooling fan.

Because of the problems described above, there has been a challenge in how to realize an electric power saving and a noise reduction in cooling heat generating parts in a server installation. Here, the challenge lies not only in an information processing apparatus such as a server installation but also similarly in various types of electronic apparatuses which cool a plurality of heat generating parts by using a cooling device.

SUMMARY

According to an aspect of an embodiment of the invention, a cooling controlling apparatus that cools an electronic apparatus includes a cooling fan that discharges air in an inside of the electronic apparatus to an outside of the electronic apparatus; an intake air temperature detector that detects a temperature of air taken into the electronic apparatus by the cooling fan; a part temperature detector that detects a temperature of an electronic part arranged inside the electronic apparatus; and a fan controller that controls a rotation number of the cooling fan based on the detected temperature of the electronic part and the detected intake air temperature.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A is a block diagram of a configuration of an electronic apparatus according to a first embodiment;

FIG. 2 is a block diagram of a configuration of a server installation according to a second embodiment;

FIG. 3A illustrates threshold values for intake air temperature according to the second embodiment;

FIG. 3B illustrates threshold values for part temperature according to the second embodiment;

FIG. 9B is a block diagram of the configuration of the conventional server installation.

DESCRIPTION OF EMBODIMENTS

Preferred embodiments of the present invention will be explained in detail below with reference to accompanying drawings. Here, while a server installation is taken as an example of an electronic apparatus to be illustrated in embodiments below, a communication device such as a switching mechanism, a router, and a local area network switch may substitute. In other words, the disclosed technique will not be limit to the embodiments to be described below.

[a] First Embodiment

Figure 1B:
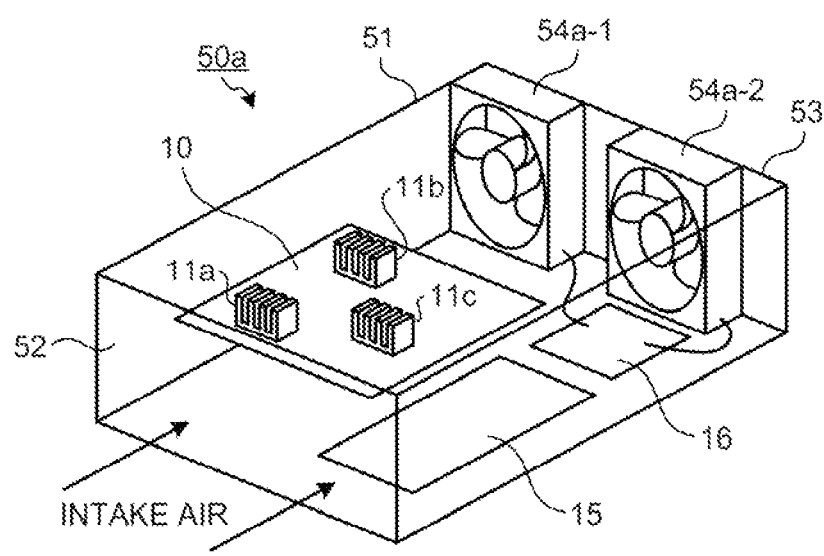
FIG. 1B is a perspective view of the configuration of the electronic apparatus according to the first embodiment.

FIG. 1A is a block diagram of a configuration of an electronic apparatus according to a first embodiment. FIG. 1B is a perspective view of the configuration of the electronic apparatus according to the first embodiment. An electronic apparatus $50a$ according to the first embodiment is provided with, in an inside of a housing 51 having a cubic shape for example, a circuit board 10, a temperature monitor/cooling controller 15, a cooling device controller 16, and cooling fans $54a$-1 and $54a$-2 as illustrated in FIG. 1B. On the circuit board 10, electronic parts $11a$, $11b$, and $11c$ are mounted.

Here, the circuit board is, for example, a system board or a motherboard. The electronic parts $11a$ to $11c$ are semiconductor elements which generate heat according to operations. However, the electronic parts $11a$ to $11c$ are not limited to semiconductor elements and may be electronic devices which generate heat according to an operation, for example, a storage device having a storage medium. Besides, the electronic parts $11a$ to $11c$ may be heat radiating parts such as a heatsink and a heat pipe which facilitate a radiation of heat of an electronic part or an electronic device which generate heat according to an operation.

A cooling device provided in the electronic apparatus $50a$ is not limited to the two cooling fans $54a$-1 and $54a$-2. Besides, the electronic parts mounted on the circuit board 10 provided in the electronic apparatus $50a$ are not limited to the three electronic parts $11a$, $11b$, and $11c$ and the number of parts can be arbitrarily set as long as the number is plural.

As illustrated in FIG. 1B, the housing 51 is provided with a front plate 52 and a back plate 53 facing the front plate 52. In the front plate 52, an air intake surface is provided. In the back plate 53, an air discharge surface is provided.

The cooling fans $54a$-1 and $54a$-2 are arranged in a manner of fronting onto the back plate 53 in the inside of the housing 51. The cooling fans $54a$-1 and $54a$-2 are axial flow fans having a blade part, for example. Through a rotation of the blade part of the cooling fans $54a$-1 and $54a$-2, cooling air is taken in the inside of the housing 51 from the air intake surface of the front plate 52.

Here, the cooling fans $54a$-1 and $54a$-2 are not limited to axial flow fans and may be any fans such as an air blower and a diagonal flow fan which allow taking in and discharging cooling air by bias in a proper direction in the housing 51 of the electronic apparatus $50a$.

Cooling air taken in the inside of the housing 51 cools the electronic parts $11a$ to $11c$ mounted on the circuit board 10 via flow paths A and B. The cooling air in the flow path A mainly cools the electronic parts $11a$ and $11b$. The cooling air in the flow path B mainly cools the electronic part $11c$.

The cooling air which has cooled the electronic parts $11a$ to $11c$ is discharged to an outside of the housing 51 by the cooling fans $54a$-1 and $54a$-2 via the air discharge surface provided in the back plate 53. Especially, the cooling air in the flow path A is discharged by the cooling fan $54a$-1 to the outside of the housing 51 via the air discharge surface provided in the back plate 53. Besides, the cooling air in the flow path B is discharged by the cooling fan $54a$-2 to the outside of the housing 51 via the air discharge surface provided in the back plate 53.

As illustrated in FIG. 1A, the electronic apparatus $50a$ is provided with the circuit board 10, an intake air temperature detector 13, the temperature monitor/cooling controller 15, the cooling device controller 16, and the cooling fans $54a$-1 and $54a$-2.

In the circuit board 10, a part temperature detector $12a$ adjacent to the electronic part $11a$ mounted on the circuit board 10 is arranged. The part temperature detector $12a$ is a temperature sensor such as a thermistor and a semiconductor temperature sensor which detects a temperature of the electronic part $11a$. Similarly, part temperature detectors $12b$ and $12c$ respectively adjacent to the electronic parts $11b$ and $11c$ are arranged. The part temperature detectors $12b$ and $12c$ are temperature sensors which detect temperatures of the electronic parts 11b and 11c, respectively.

The part temperature detectors 12a to 12c are preferably arranged at leeward sides of the electronic parts 11a to 11c in the flow path A or the flow path B of the cooling air, respectively. This arrangement of each electronic part allows measuring a temperature of each electronic part after cooling by cooling air more precisely.

The intake air temperature detector 13 is arranged between the front plate 52 of the housing 51 and the circuit board 10. Then, the intake air temperature detector 13 detects a temperature of intake air of the cooling air taken in the inside of the housing 51 via the intake air surface of the front plate 52.

The part temperature detectors 12a to 12c and the intake air temperature detector 13 are connected to the temperature monitor/cooling controller 15 via an interface 14 such as an inter integrated-circuit interface (I2C I/F). The part temperature detectors 12a to 12c notify detected temperatures of the electronic parts respectively to the temperature monitor/cooling controller 15. Besides, the intake air temperature detector 13 notifies a detected intake air temperature to the temperature monitor/cooling controller 15.

The temperature monitor/cooling controller 15 is provided with a threshold value storing unit 15a and a controller 15b. The temperature monitor/cooling controller 15 includes a semiconductor storage device such as a read-only memory (ROM) and a semiconductor processing device such as a micro processing unit (MPU). The threshold value storing unit 15a is realized by the ROM and the controller 15b is realized by the MPU, for example.

The threshold value storing unit 15a stores an intake air temperature threshold value 15a-1 and a part temperature threshold value 15a-2. The intake air temperature threshold value 15a-1 includes threshold values for determining "high" or "low" of the intake air temperature of the cooling air detected by the intake air temperature detector 13. The intake air temperature threshold value 15a-1 includes three threshold values: a "threshold value 1"; a "threshold value 2" which is more than the "threshold value 1"; and a "threshold value 3" which is more than the "threshold value 2", for example.

Besides, the part temperature threshold value 15a-2 includes, for each electronic part, threshold values for determining "high" or "low" of the temperature of each of the electronic parts 11a to 11c respectively detected by the part temperature detector 12a to 12c. The part temperature threshold value 15a-2 includes, for each electronic part, four threshold values: a "threshold value 1"; a "threshold value 2" which is more than the "threshold value 1"; a "threshold value 3" which is more than the "threshold value 2"; and a "threshold value 4" which is more than the "threshold value 3", for example.

Here, the number of threshold values included in the intake air temperature threshold value 15a-1 is not limited to three. In addition, the number of threshold values included in the part temperature threshold value 15a-2 is not limited to four and any plural number may be adopted.

The controller 15b compares the intake air temperature of the cooling air detected by the intake air temperature detector 13 to the intake air temperature threshold value 15a-1. The controller 15b then determines the number of rotation of the cooling fans 54a-1 and 54a-2 depending on a result of the comparison.

For example, when the intake air temperature of the cooling air is equal to or less than the "threshold value 1" of the intake air temperature threshold value 15a-1, the controller 15b determines the number of rotation of the cooling fans 54a-1 and 54a-2 to be "1 rotation per minute (RPM)".

Besides, when the intake air temperature of the cooling air is more than the "threshold value 1" and equal to or less than the "threshold value 2" of the intake air temperature threshold value 15a-1, the controller 15b determines the number of rotation of the cooling fans 54a-1 and 54a-2 to be "RN2 [RPM]". Besides, when the intake air temperature of the cooling air is more than the "threshold value 2" and equal to or less than the "threshold value 3" of the intake air temperature threshold value 15a-1, the controller 15b determines the number of rotation of the cooling fans 54a-1 and 54a-2 to be "RN3 [RPM]". Here, the numbers of rotation "RN1 [RPM]", "RN2 [RPM]", and "RN3 [RPM]" have a relation satisfying "RN1 [RPM]"<"RN2 [RPM]"<"RN3 [RPM]".

Since a speed of the cooling air is constant when the number of fan rotation is constant, a higher intake air temperature of the cooling air reduces a cooling efficiency of electronic parts by the cooling air. However, the reduction of the cooling efficiency of the electronic parts can be suppressed by determining the number of rotation of the cooling fans 54a-1 and 54a-2 to be large and increasing the speed of the cooling air when the intake air temperature of the cooling air is high.

After determining the number of rotation of the cooling fans 54a-1 and 54a-2, the controller 15b then performs, after a waiting time period $\Delta T$, a "determination for starting increase/decrease control" of the number of rotation of the cooling fans 54a-1 and 54a-2. The "determination for starting increase/decrease control" will be explained later.

When the intake air temperature of the cooling air is more than the "threshold value 3" of the intake air temperature threshold value 15a-1, the controller 15b notifies an "abnormality warning on intake air temperature" to a controlling device which, not illustrated, controls entire operations of the electronic apparatus 50a. The controlling device which, not illustrated, controls entire operations of the electronic apparatus 50a, for example, stops the operations of the electronic apparatus 50a itself when the "abnormality warning on intake air temperature" is notified.

The controller 15b compares the temperature of each of the electronic parts 11a to 11c respectively detected by the part temperature detectors 12a to 12c to the part temperature threshold value 15a-2 provided for each electronic part. The controller 15b then controls to increase/decrease the number of rotation of the cooling fans 54a-1 and 54a-2 from the number of rotation "r" [RPM] determined by the controller 15b by a "predetermined variation unit".

Here, the "predetermined variation unit" is a percentage with respect to maximum number of rotation of the cooling fans 54a-1 and 54a-2, for example. In other words, the controller 15b decreases the number of rotation of the cooling fans 54a-1 and 54a-2 determined by the controller 15b by $\alpha$ [%] or increases the number of rotation by $\beta$ [%]. Here, the values $\alpha$ and $\beta$ are not limited to the percentage and may be the number of rotation.

The controller 15b starts increasing/decreasing control of the number of rotation of the cooling fans 54a-1 and 54a-2 when the temperature of each of all the electronic parts 11a to 11c is equal to or less than the "threshold value 1" of the part temperature threshold value 15a-2 provided for each electronic part. The determination of whether or not the temperature of each of all the electronic parts 11a to 11c is equal to or less than the "threshold value 1" of the part temperature threshold value 15a-2 provided for each electronic part is the "determination for starting increase/decrease control".

When each part temperature is more than the "threshold value 1" and equal to or less than the "threshold value 2" of the part temperature threshold value 15a-2 provided for each electronic part, the controller 15b decreases the number of rotation of the cooling fans 54a-1 and 54a-2 by α [%]. Besides, when each part temperature is more than the "threshold value 2" and equal to or less than the "threshold value 3" of the part temperature threshold value 15a-2 provided for each electronic part, the controller 15b does not increase/decrease the number of rotation of the cooling fans 54a-1 and 54a-2. Besides, when each part temperature is more than the "threshold value 3" and equal to or less than the "threshold value 4" of the part temperature threshold value 15a-2 provided for each electronic part, the controller 15b increases the number of rotation of the cooling fans 54a-1 and 54a-2 by β[%]. The control explained above is a "control of increasing/decreasing the number of fan rotation".

After increasing/decreasing the number of rotation of the cooling fans 54a-1 and 54a-2, the controller 15b again repeats the control of increasing/decreasing the number of rotation of cooling devices 54a and 54b after a waiting time period Δt.

Here, the values α and β described above may satisfy a relation expressed by α<β. In fact, an increase in temperature of an electronic part directly leads to a stop of the electronic apparatus 50a itself. For this reason, a wide range for the increase of the number of rotation of the cooling fans 54a-1 and 54a-2 is set, so that an electronic part can be cooled at high speed. An excessive cooling of an electronic part, though having a problem in noise and excessive electric power consumption associated with the rotation of the cooling device, does not cause a stop of the electronic apparatus 50a itself. Therefore, the variation unit for the number of fan rotation is set as α<β, so that a continuity of the operation of the electronic apparatus 50a can further be enhanced.

In addition, the waiting time period Δt described above may be a very short time interval compared with the waiting time period ΔT. For example, the waiting time period Δt may be one minute when the waiting time period ΔT is thirty minutes. The waiting time period Δt is set to be a very short time interval compared with the waiting time period ΔT in this manner, so that the "increase/decrease control" of the number of fan rotation can be performed carefully in response to the temperature of an electronic part which momentarily changes depending on operating conditions.

The controller 15b notifies the determined number of rotation of the cooling fans 54a-1 and 54a-2, r [RPM] to the cooling device controller 16. Besides, the controller 15b notifies the number of fan rotation r1 [RPM] which is obtained by decreasing the number of fan rotation r [RPM] by α [%] and the number of fan rotation r2 [RPM] which is obtained by increasing the number of fan rotation r [RPM] by β [%] to the cooling device controller 16.

The cooling device controller 16 selects and provides to the cooling fans 54a-1 and 54a-2 a control pulse according to the number of fan rotation r [RPM], the number of fan rotation r1 [RPM], or the number of fan rotation r2 [RPM] notified by the controller 15b or the controller 15b. The cooling fans 54a-1 and 54a-2 rotate blade parts according to the control pulse provided by the cooling device controller 16.

As described above, the number of rotation of the cooling fans 54a-1 and 54a-2, r [RPM] determined based on the intake air temperature is further increased/decreased according to a temperature of each electronic part in the first embodiment. Therefore, the number of fan rotation can be controlled carefully without reducing the cooling efficiency. Besides, a noise of a fan rotation of a cooling device and an excessive electric power consumption caused by an excessive cooling of an electronic part can be avoided appropriately. In addition, a stop of the electronic apparatus 50a for preventing a runaway effect of an electronic part due to insufficiency in cooling can be avoided appropriately.

[b] Second Embodiment

FIG. 2 is a block diagram of a configuration of a server installation according to a second embodiment. In the second embodiment, only a different part from the first embodiment will be explained and an explanation for the same configuration will be omitted. As illustrated in FIG. 2, a server installation 50b according to the second embodiment is provided with, in an inside of a housing 51b, a system board 20, an intake air temperature sensor 23, a temperature monitor/cooling controller 25, a fan controlling device 26, and cooling fans 54b-1 and 54b-2.

The cooling fans 54b-1 and 54b-2 are arranged in a manner of fronting onto a back plate 53b in the inside of the housing 51b. The cooling fans 54b-1 and 54b-2 are axial flow fans having a blade part, for example. Through a rotation of the blade part of the cooling fans 54b-1 and 54b-2, cooling air is taken in the inside of the housing 51 from an air intake surface of a front plate 52b.

Cooling air taken in the inside of the housing 51b cools devices 21a to 21c mounted on the system board 20 and is then discharged by the cooling fans 54b-1 and 54b-2 to an outside of the housing 51b via an air discharge surface of the back plate 53b.

In the system board 20, a temperature sensor 22a adjacent to the device 21a mounted on the system board 20 is arranged. Here, the "device" represents an electronic part such as a semiconductor element which generates heat according to an operation or a heat generating part which generates heat. The temperature sensor 22a is a temperature sensor such as a thermistor and a semiconductor temperature sensor which detects a temperature of the device 21a. Similarly, temperature sensors 22b and 22c respectively adjacent to the devices 21b and 21c are arranged. The temperature sensors 22b and 22c are temperature sensors which detect the temperatures of the devices 21b and 21c, respectively.

The temperature sensors 22a to 22c are preferably arranged at leeward sides of the devices 21a to 21c in a flow path of cooling air, respectively. This arrangement allows measuring a temperature of each device after cooling by cooling air more precisely.

The intake air temperature sensor 23 is arranged between the front plate 52b of the housing 51b and the system board 20. Then, the intake air temperature sensor 23 detects the temperature of intake air of the cooling air taken in the inside of the housing 51b via the intake air surface of the front plate 52b.

The temperature sensors 22a to 22c and the intake air temperature sensor 23 are connected to the temperature monitor/cooling controller 25 via an inter integrated-circuit interface (I2C I/F) 24. The temperature sensors 22a to 22c notify detected temperatures of the devices respectively to the temperature monitor/cooling controller 25. Besides, the intake air temperature sensor 23 notifies a detected intake air temperature to the temperature monitor/cooling controller 25.

The temperature monitor/cooling controller 25 is provided with a threshold value storing unit 25a, a fan operation amount determining unit 25b, and a fan operation amount increasing/decreasing unit 25c. The threshold value storing unit 25a stores an intake air temperature threshold value 25a-1 and a part temperature threshold value 25a-2. The intake air temperature threshold value 25a-1 includes "25° C." as a "threshold value 1", "30° C." as a "threshold value 2", and "35° C." as a "threshold value 3" as illustrated in FIG. 3A. FIG. 3A illustrates threshold values for intake air temperature according to the second embodiment. The values of the "threshold value 1", the "threshold value 2", and the "threshold value 3" have a relation satisfying "threshold value 1"<"threshold value 2"<"threshold value 3". The values of the "threshold value 1", the "threshold value 2", and the "threshold value 3" are set in advance according to heat-generation characteristics of an entirety of the server installation 50b. Here, specific numerals for the "threshold value 1", the "threshold value 2", and the "threshold value 3" illustrated in FIG. 3A are provided only as one example.

As illustrated in FIG. 3B, the part temperature threshold value 25a-2 includes, for each device, a "threshold value 1", a "threshold value 2", a "threshold value 3", and a "threshold value 4". FIG. 3B illustrates threshold values for part temperature according to the second embodiment. As illustrated in FIG. 3B, the part temperature threshold value of the device 21a includes "30° C." as the "threshold value 1", "55° C." as the "threshold value 2", "70° C." as the "threshold value 3", and "80° C." as the "threshold value 4".

Similarly, the part temperature threshold value of the device 21b includes "30° C." as the "threshold value 1", "55° C." as the "threshold value 2", "75° C." as the "threshold value 3", and "85° C." as the "threshold value 4". Besides, the part temperature threshold value of the device 21c includes "20° C." as the "threshold value 1", "50° C." as the "threshold value 2", "65° C." as the "threshold value 3", and "85° C." as the "threshold value 4".

The values of the "threshold value 1", the "threshold value 2", the "threshold value 3", and the "threshold value 4" have a relation satisfying "threshold value 1"<"threshold value 2"<"threshold value 3"<"threshold value 4". The values of the "threshold value 1", the "threshold value 2", the "threshold value 3", and the "threshold value 4" are set in advance according to heat-generation characteristics of each device. Here, specific numerals for the "threshold value 1", the "threshold value 2", the "threshold value 3", and the "threshold value 4" illustrated in FIG. 3B for each device are provided only as one example.

The fan operation amount determining unit 25b compares an intake air temperature of the cooling air detected by the intake air temperature sensor 23 to the intake air temperature threshold value 25a-1. The fan operation amount determining unit 25b then determines the number of rotation of the cooling fans 54b-1 and 54b-2 depending on a result of the comparison.

For example, when the intake air temperature of the cooling air is equal to or less than the "threshold value 1" ("25° C.") of the intake air temperature threshold value 25a-1, the fan operation amount determining unit 25b determines the number of rotation of the cooling fans 54b-1 and 54b-2 "r" to be "2000 [RPM]". When the intake air temperature of the cooling air is more than the "threshold value 1" ("25° C.") and equal to or less than the "threshold value 2" ("30° C.") of the intake air temperature threshold value 25a-1, the fan operation amount determining unit 25b determines the number of rotation of the cooling fans 54b-1 and 54b-2 "r" to be "3000 [RPM]". When the intake air temperature of the cooling air is more than the "threshold value 2" ("30° C.") and equal to or less than the "threshold value 3" ("35° C.") of the intake air temperature threshold value 25a-1, the fan operation amount determining unit 25b determines the number of rotation of the cooling fans 54b-1 and 54b-2 "r" to be "4000 [RPM]". It should be noted that the specific numeral for the number of rotation "r" to be determined depending on the "threshold value 1", the "threshold value 2", and the "threshold value 3" of the intake air temperature threshold value 25a-1 is provided only as one example.

After determining the number of rotation of the cooling fans 54b-1 and 54b-2, the fan operation amount determining unit 25b then performs, after a waiting time period ΔT=30 min., a "determination for starting increase/decrease control" of the number of rotation of the cooling fans 54b-1 and 54b-2.

The fan operation amount determining unit 25b starts increasing/decreasing control of the number of rotation of the cooling fans 54b-1 and 54b-2 when the part temperature of each of all the devices 21a to 21c is equal to or less than the "threshold value 1" of the part temperature threshold value 25a-2 provided for each electronic part. The determination of whether or not the part temperature of each of all the devices 21a to 21c is equal to or less than the "threshold value 1" of the part temperature threshold value 25a-2 provided for each electronic part is the "determination for starting increase/decrease control".

When each device temperature is more than the "threshold value 1" and equal to or less than the "threshold value 2" of the part temperature threshold value 25a-2 provided for each device, the fan operation amount increasing/decreasing unit 25c decreases the number of rotation of the cooling fans 54b-1 and 54b-2 by α=1 [%]. Besides, when each device temperature is more than the "threshold value 2" and equal to or less than the "threshold value 3" of the part temperature threshold value 25a-2 provided for each device, the fan operation amount increasing/decreasing unit 25c neither increases nor decreases the number of rotation of the cooling fans 54b-1 and 54b-2. Besides, when each device temperature is more than the "threshold value 3" and equal to or less than the "threshold value 4" of the part temperature threshold value 25a-2 provided for each device, the fan operation amount increasing/decreasing unit 25c increases the number of rotation of the cooling fans 54b-1 and 54b-2 by β=5 [%]. The control explained above is a "control of increasing/decreasing the number of fan rotation". Here, the values "α=1 [%]" and "β=5 [%]" are set in advance according to heat-generation characteristics based on the entire operation of the server installation 50b.

After increasing/decreasing the number of rotation of the cooling fans 54b-1 and 54b-2, the fan operation amount increasing/decreasing unit 25c again repeats the control of increasing/decreasing the number of rotation of the cooling fans 54b-1 and 54b-2 after a waiting time period Δt=1 min., for example.

The fan operation amount determining unit 25b notifies the determined number of rotation of the cooling fans 54b-1 and 54b-2, r [RPM] to the fan controlling device 26. The fan operation amount increasing/decreasing unit 25c notifies the number of fan rotation r1 [RPM] which is obtained by decreasing the number of fan rotation r [RPM] by α=1 [%] and the number of fan rotation "r2" [RPM] which is obtained by increasing the number of fan rotation r [RPM] by β=5 [%] to the fan controlling device 26.

The fan controlling device 26 selects and provides to the cooling fans 54b-1 and 54b-2 a control pulse according to the number of fan rotation r [RPM], the number of fan rotation r1 [RPM], or the number of fan rotation r2 [RPM] notified from the fan operation amount determining unit 25b or the fan operation amount increasing/decreasing unit 25c. The cooling fans 54b-1 and 54b-2 rotate blade parts according to the control pulse provided by the fan controlling device 26. Here, the cooling fans 54b-1 ad 54b-2 transmit a rotation speed signal (TACH) of the blade part thereof to the fan controlling device 26. The fan controlling device 26 controls, while monitoring the rotation speed signal transmitted from the cooling fans 54b-1 and 54b-2, the cooling fans 54b-1 and 54b-2 so that the number of fan rotation will meet the target.

Here, a cooling controlling apparatus 20a includes the temperature sensors 22a to 22c, the intake air temperature sensor 23, the I2C I/F 24, the temperature monitor/cooling controller 25, and the fan controlling device 26.

Figure 4A:
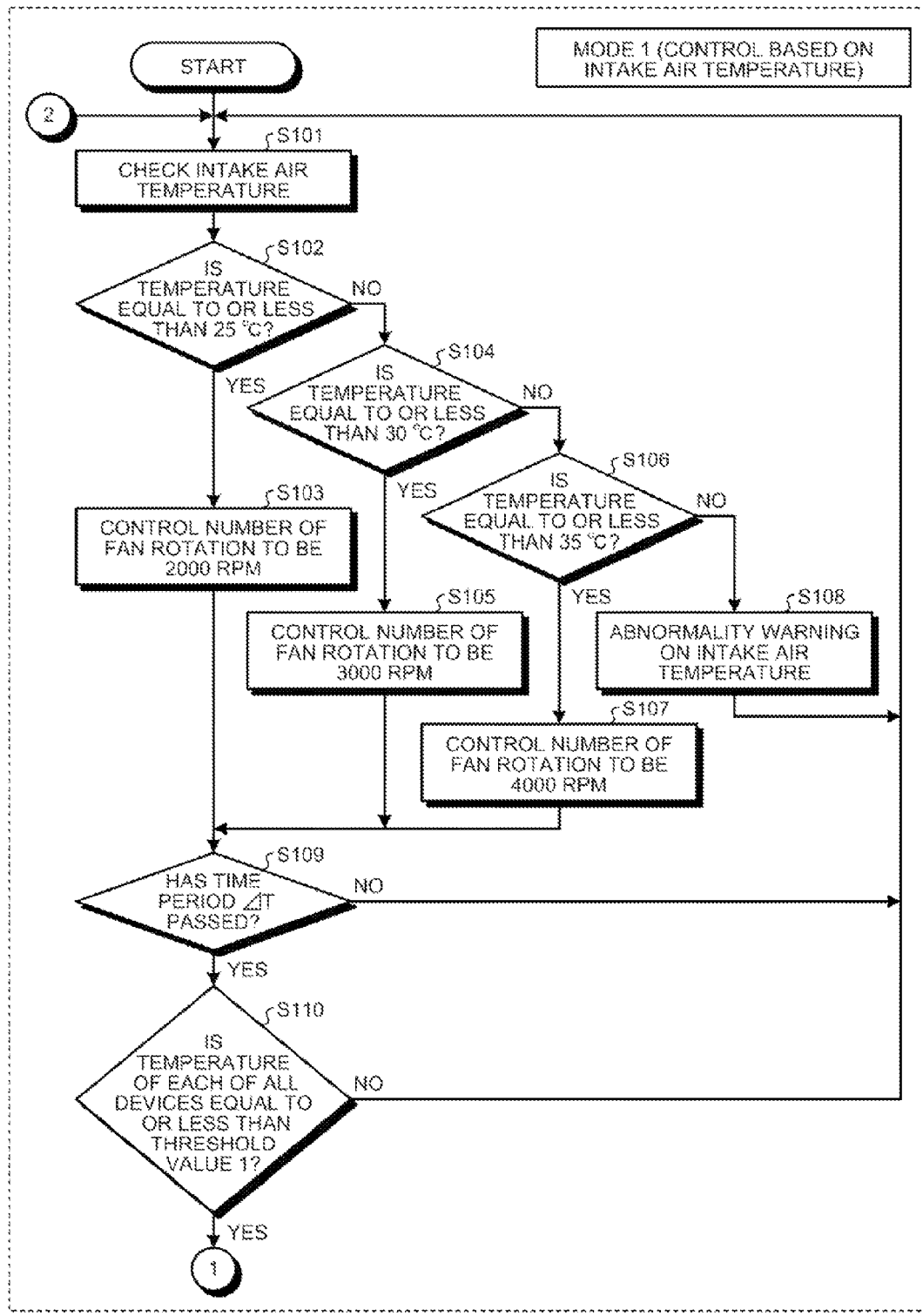
FIG. 4A is a flowchart of a procedure of a cooling fan controlling process (mode 1) according to the second embodiment.
Figure 4B:
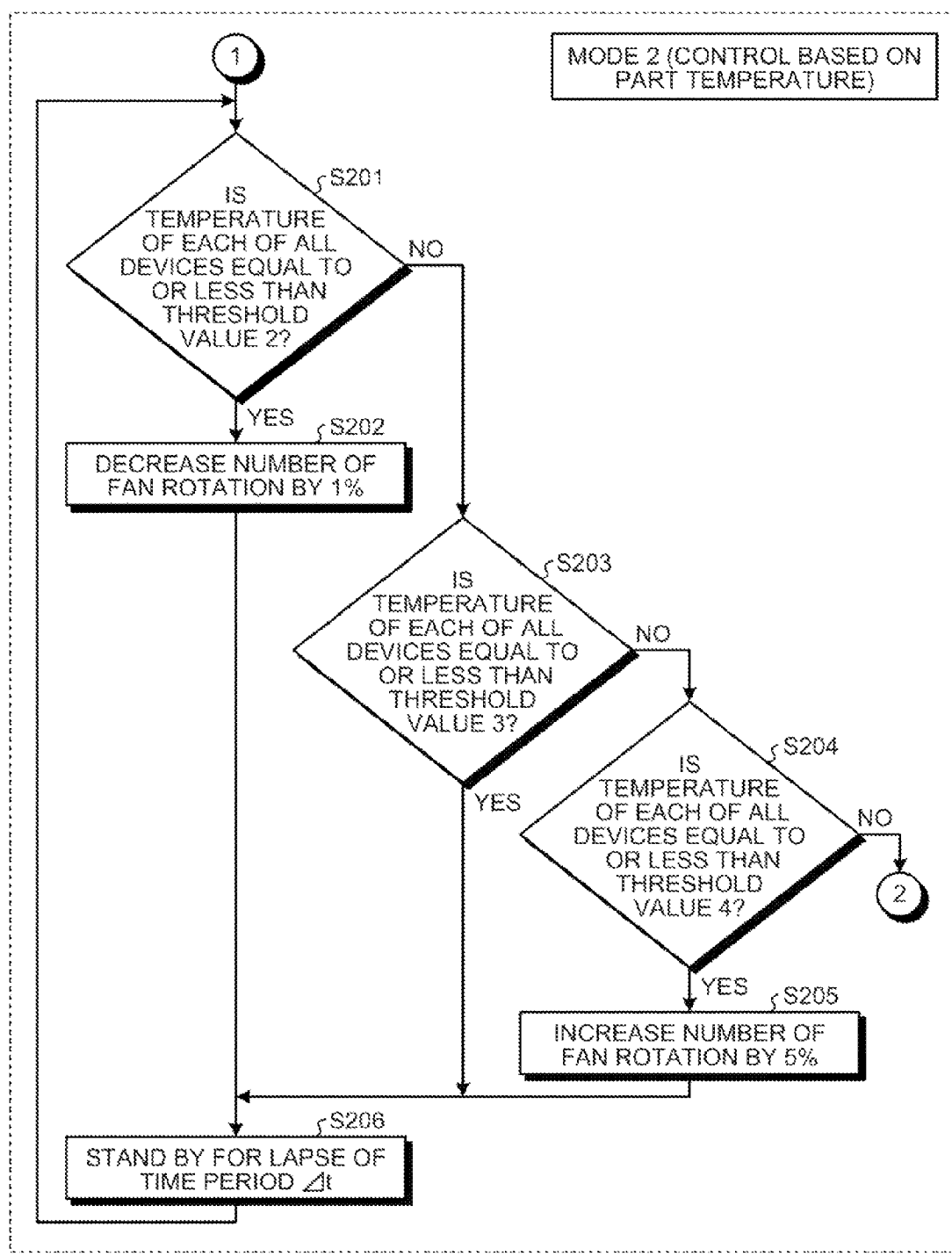
FIG. 4B is a flowchart of a procedure of a cooling fan controlling process (mode 2) according to the second embodiment.

Next, a cooling fan controlling process according to the second embodiment will be explained with reference to FIGS. 4A and 4B. FIG. 4A is a flowchart of a procedure of a cooling fan controlling process (mode 1) according to the second embodiment. FIG. 4B is a flowchart of a procedure of a cooling fan controlling process (mode 2) according to the second embodiment. Here, the cooling fan controlling process in mode 1 performs controlling cooling fans according to the intake air temperature of the cooling air. In addition, the cooling fan controlling process in mode 2 performs controlling the cooling fans according to the part temperature of the device. The cooling fan controlling processes (mode 1 and mode 2) are performed by the temperature monitor/cooling controller 25.

At step S101, the fan operation amount determining unit 25b of the temperature monitor/cooling controller 25 first checks the intake air temperature of the cooling air detected by the intake air temperature sensor 23. Next at step S102, the fan operation amount determining unit 25b determines whether or not the intake air temperature of the cooling air detected by the intake air temperature sensor 23 is equal to or less than the "threshold value 1" ("25° C.") of the intake air temperature threshold value 25a-1.

When the intake air temperature of the cooling air detected by the intake air temperature sensor 23 is determined to be equal to or less than the "threshold value 1" ("25° C.") of the intake air temperature threshold value 25a-1 ("Yes" at step S102), the process moves to step S103. When the intake air temperature of the cooling air detected by the intake air temperature sensor 23 is not determined to be equal to or less than the "threshold value 1" ("25° C.") of the intake air temperature threshold value 25a-1 ("No" at step S102), the process moves to step S104.

At step S103, the fan operation amount determining unit 25b determines the number of fan rotation "r" to be 2000 [RPM] and notifies the determined number to the fan controlling device 26. The fan controlling device 26 then controls the cooling fans 54b-1 and 54b-2 to realize the notified number of fan rotation "r"=2000 [RPM] (step S103). On completion of step S103, the process moves to step S109.

At step S104, the fan operation amount determining unit 25b determines whether or not the intake air temperature of the cooling air detected by the intake air temperature sensor 23 is equal to or less than the "threshold value 2" ("30° C.") of the intake air temperature threshold value 25a-1.

When the intake air temperature of the cooling air detected by the intake air temperature sensor 23 is determined to be equal to or less than the "threshold value 2" ("30° C.") of the intake air temperature threshold value 25a-1 ("Yes" at step S104), the process moves to step S105. When the intake air temperature of the cooling air detected by the intake air temperature sensor 23 is not determined to be equal to or less than the "threshold value 2" ("30° C.") of the intake air temperature threshold value 25a-1 ("No" at step S104), the process moves to step S106.

At step S105, the fan operation amount determining unit 25b determines the number of fan rotation "r" to be 3000 [RPM] and notifies the determined number to the fan controlling device 26. The fan controlling device 26 then controls the cooling fans 54b-1 and 54b-2 to realize the notified number of fan rotation "r"=3000 [RPM] (step S105). On completion of step S105, the process moves to step S109.

At step S106, the fan operation amount determining unit 25b determines whether or not the intake air temperature of the cooling air detected by the intake air temperature sensor 23 is equal to or less than the "threshold value 3" ("35° C.") of the intake air temperature threshold value 25a-1.

When the intake air temperature of the cooling air detected by the intake air temperature sensor 23 is determined to be equal to or less than the "threshold value 3" ("35° C.") of the intake air temperature threshold value 25a-1 ("Yes" at step S106), the process moves to step S107. When the intake air temperature of the cooling air detected by the intake air temperature sensor 23 is not determined to be equal to or less than the "threshold value 3" ("35° C.") of the intake air temperature threshold value 25a-1 ("No" at step S106), the process moves to step S108.

At step S107, the fan operation amount determining unit 25b determines the number of fan rotation r to be 4000 [RPM] and notifies the determined number to the fan controlling device 26. The fan controlling device 26 then controls the cooling fans 54b-1 and 54b-2 to realize the notified number of fan rotation r=4000 [RPM] (step S107). On completion of step S107, the process moves to step S109.

At step S108, since the intake air temperature of the cooling air is more than the "threshold value 3" of the intake air temperature threshold value 25a-1, the fan operation amount determining unit 25b notifies an "abnormality warning on intake air temperature" to a controlling device which, not illustrated, controls entire operations of the server installation 50b. On completion of step S108, the process moves to step S101. The controlling device which, not illustrated, controls entire operations of the server installation 50b, for example, stops the operations of the server installation 50b itself when the "abnormality warning on intake air temperature" is notified.

At step S109, the fan operation amount determining unit 25b determines whether or not the waiting time period ΔT=30 min. has passed after starting counting the time period ΔT as a first time period while step S103, step S105, or step S107 continues. When the time period ΔT=30 min. is determined to have passed from the start of counting the first time period ΔT, ("Yes" at step S109), the process moves to step S110. When the time period ΔT=30 min. is not determined to have passed from the start of counting the first time period ΔT, ("No" at step S109), the process moves to step S101.

At step S110, the fan operation amount increasing/decreasing unit 25c determines whether or not the temperature of each of all the devices is equal to or less than the "threshold value 1" of the part temperature threshold value 25a-2 provided for each device. When each device temperature is determined to be equal to or less than the "threshold value 1" of the part temperature threshold value 25a-2 provided for each device ("Yes" at step S110), the process moves to step S201 in FIG. 4B. When each device temperature is not determined to be equal to or less than the "threshold value 1" of the part temperature threshold value 25a-2 provided for each device ("No" at step S110), the process moves to step S101.

At step S201 in FIG. 4B, the fan operation amount increasing/decreasing unit 25c determines whether or not the temperature of each of all the devices is equal to or less than the "threshold value 2" of the part temperature threshold value 25a-2 provided for each device. When each device temperature is determined to be equal to or less than the "threshold value 2" of the part temperature threshold value 25a-2 provided for each device ("Yes" at step S201), the process moves to step S202. When each device temperature is not determined to be equal to or less than the "threshold value 2" of the part temperature threshold value 25a-2 provided for each device ("No" at step S201), the process moves to step S203.

At step S202, the fan operation amount increasing/decreasing unit 25c decreases the number of fan rotation determined in the process at step S103, step S105, or step S107 in FIG. 4A by 1%. On completion of this process, the process moves to step S206.

At step S203, the fan operation amount increasing/decreasing unit 25c determines whether or not the temperature of each of all the devices is equal to or less than the "threshold value 3" of the part temperature threshold value 25a-2 provided for each device. When each device temperature is determined to be equal to or less than the "threshold value 3" of the part temperature threshold value 25a-2 provided for each device ("Yes" at step S203), the fan operation amount increasing/decreasing unit 25c maintains the number of fan rotation determined in the process at step S103, step S105, or step S107. Then, the process moves to step S206. When each device temperature is not determined to be equal to or less than the "threshold value 3" of the part temperature threshold value 25a-2 provided for each device ("No" at step S203), the process moves to step S204.

At step S204, the fan operation amount increasing/decreasing unit 25c determines whether or not the temperature of each of all the devices is equal to or less than the "threshold value 4" of the part temperature threshold value 25a-2 provided for each device. When each device temperature is determined to be equal to or less than the "threshold value 4" of the part temperature threshold value 25a-2 provided for each device ("Yes" at step S204), the process moves to step S205. When each device temperature is not determined to be equal to or less than the "threshold value 4" of the part temperature threshold value 25a-2 provided for each device ("No" at step S204), the process moves to step S101 in FIG. 4A.

At step S205, the fan operation amount increasing/decreasing unit 25c increases the number of fan rotation determined in the process at step S103, step S105, or step S107 by 5%. On completion of this process, the process moves to step S206.

At step S206, the fan operation amount increasing/decreasing unit 25c stands by to a next process until the time period Δt=1 min. passes after starting counting the time period Δt as a second time period. On completion of this process, the process moves to step S201.

Figure 5:
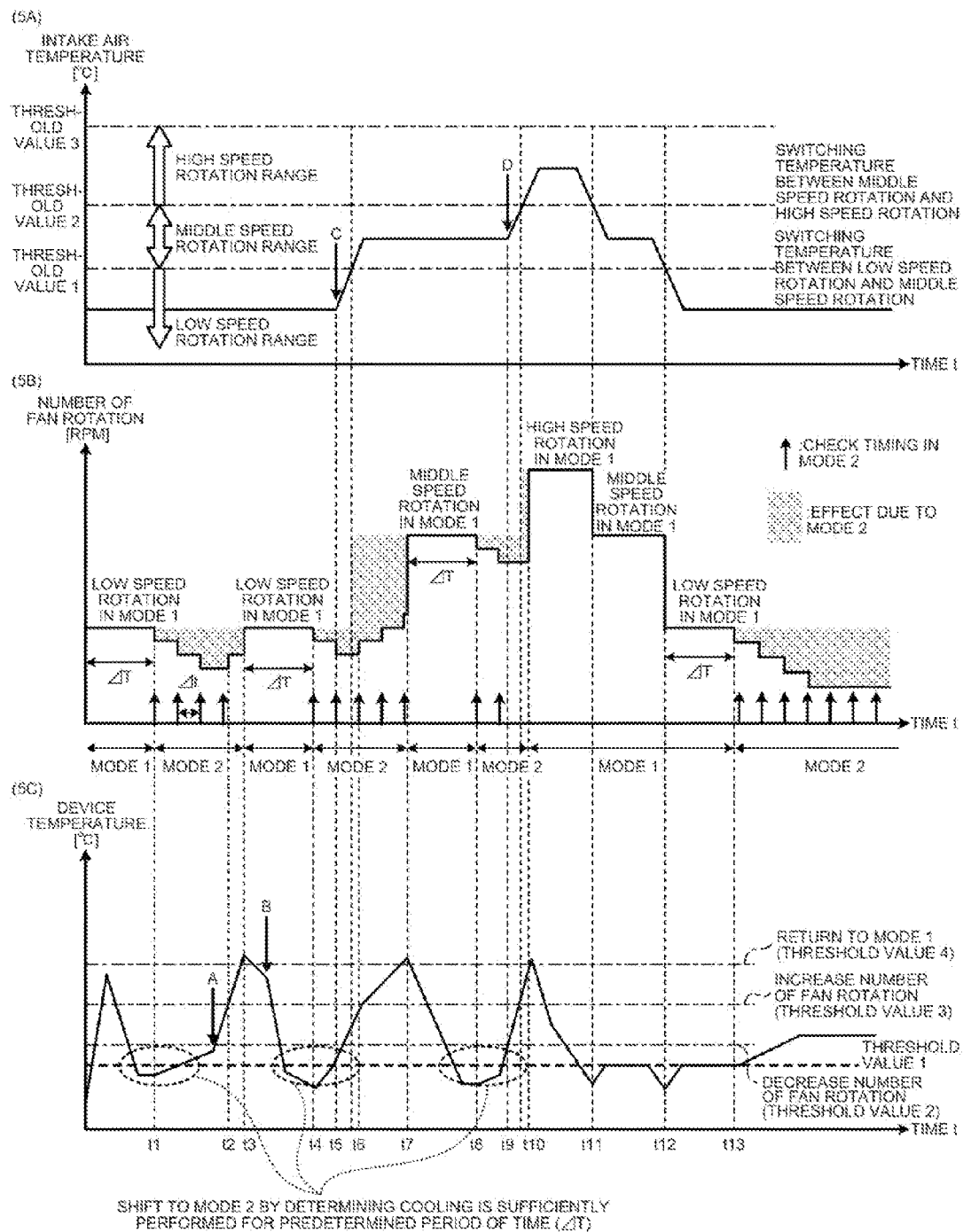
FIG. 5 illustrates a temporal change of a control of the number of fan rotation depending on an intake air temperature and a device temperature by the cooling fan controlling process according to the second embodiment.

FIG. 5 illustrates a temporal change of a control of the number of fan rotation depending on an intake air temperature and a device temperature by the cooling fan controlling process according to the second embodiment. FIG. 5 illustrates an intake air temperature, the number of fan rotation, and a device temperature in the control based on the intake air temperature (mode 1) and the control based on the part temperature (mode 2), and especially a hatching portion in the number of fan rotation represents a region in which a fan electric power and a noise can be reduced compared to the conventional technique. Here in FIG. 5, an example of one device which detects a temperature is given for ease of explanation.

In (5C) of FIG. 5, a device temperature equal to or less than the "threshold value 1" is detected at a time point t1 which is after a lapse of the time period ΔT=30 min. after starting a rotation control in a low speed rotation (2000 RPM) under the control based on the intake air temperature (mode 1). Then, the mode shifts to the control based on the part temperature (mode 2) to decrease the number of fan rotation.

In (5C) of FIG. 5, an increase in temperature occurs in response to an increase in heat generation amount due to an increase in operation load of the device at a point A. Then, an increase in temperature of the device up to the "threshold value 3" is detected at a time point t2 and the number of fan rotation is increased. Thereafter, an increase in temperature of the device over the "threshold value 4" is detected at a time point t3 and the mode returns to the control based on the intake air temperature (mode 1). Because of the low speed rotation range under a low intake air temperature (equal to or less than the "threshold value 1", i.e., "25° C.") of the cooling air at this moment, the number of fan rotation in mode 1 is determined to be the low speed rotation (2000 RPM).

In (5C) of FIG. 5, a decrease in temperature occurs in response to a decrease in heat generation amount due to a decrease in operation load of the device at a point B. Then, a device temperature equal to or less than the "threshold value 1" is detected at a time point t4 which is after a lapse of the time period ΔT=30 min. after starting the rotation control in the low speed rotation (2000 RPM) under the control based on the intake air temperature (mode 1). Then, the mode shifts to the control based on the part temperature (mode 2) to decrease the number of fan rotation.

At a point C in (5A) and a time point t5 in (5C) of FIG. 5, increases in intake air temperature of the cooling air and in device temperature occur. However, the number of fan rotation is maintained at this stage since the device temperature exceeds neither the "threshold value 3" nor the "threshold value 4".

Then at a time point t6 in (5C) of FIG. 5, an increase in device temperature up to the "threshold value 3" is detected and thereby the number of fan rotation is increased. Besides, at a time point t7 in (5C) of FIG. 5, an increase in device temperature over the "threshold value 4" is detected and thereby the mode returns to the control based on the intake air temperature (mode 1). Since the intake air temperature at this time point is more than the "threshold value 1" and equal to or less than the "threshold value 2", the number of fan rotation in mode 1 is determined to be a middle speed rotation (3000 RPM).

At a time point t8 in (5C) of FIG. 5, a decrease in temperature occurs in response to a decrease in heat generation amount due to a decrease in operation load of the device. More specifically, a device temperature equal to or less than the "threshold value 1" is detected after a lapse of the time period ΔT=30 min. in the middle speed rotation in mode 1. Then, the mode shifts to the control based on the part temperature (mode 2) to decrease the number of fan rotation.

At a point D in (5A) and at a time point t9 in (5C) of FIG. 5, increases in intake air temperature of the cooling air and in device temperature occur. However, the number of fan rotation is maintained at this stage since the device temperature exceeds neither the "threshold value 3" nor the "threshold value 4".

At a time point t10 in (5C) of FIG. 5, an increase in device temperature over the "threshold value 4" is detected and thereby the mode returns to the control based on the intake air temperature (mode 1). Since the intake air temperature at this time point is more than the "threshold value 2" and equal to or less than the "threshold value 3", the number of fan rotation is determined to be the middle speed rotation (3000 RPM).

Since the intake air temperature becomes more than the "threshold value 1" and equal to or less than the "threshold value 2" during mode 1, the number of fan rotation is determined to be the low speed rotation (2000 RPM). Then, a device temperature equal to or less than the "threshold value 1" is detected at a time point t13 which is after a lapse of the time period ΔT=30 min. after starting a rotation control in the low speed rotation (2000 RPM) under the control based on the intake air temperature (mode 1). Then, the mode shifts to the control based on the part temperature (mode 2) to decrease the number of fan rotation.

As described so far, since the number of rotation of the cooling fans 54b-1 and 54b-2 r [RPM] which is determined according to the intake air temperature is further increased or decreased according to the temperature of each device, the number of fan rotation can be controlled carefully in the second embodiment.

Specifically, the number of rotation of the cooling fans 54b-1 and 54b-2 r determined according to the intake air temperature is decreased by α=1 [%] when the temperature of each device is equal to or less than the own "threshold value 2". By this, a noise and an excessive electric power consumption, caused by an excessive cooling of a device, in the cooling fan rotation can be avoided appropriately.

In addition, the number of rotation of the cooling fans 54b-1 and 54b-2 r determined according to the intake air temperature is increased by β=5 [%] according to a temperature, exceeding a temperature threshold value, of a device. By this, insufficiency in cooling of the server installation 50b can be prevented. Then, a stop of the server installation 50b for preventing a runaway effect of a device due to insufficiency in cooling can be avoided appropriately.

[c] Third Embodiment

In a third embodiment, the number of fan rotation is controlled so as not to fall below minimum number of cooling fan rotation "PMW_duty [min]" which is obtained according to an intake air temperature x [° C.] of cooling air in controlling to increase/decrease the number of fan rotation in the cooling fan controlling process in mode 2 explained in the second embodiment. Here, a value for the minimum number of cooling fan rotation "PMW_duty [min]" indicates the number of cooling fan rotation which is needed for cooling a device of the server installation 50b when the intake air temperature is x [° C.]. The value "PMW_duty [min]" is obtained by the following Equation where the intake air temperature of the cooling air is x [° C.].

$$\text{PMW duty [min]} = E \cdot x^3 + F \cdot x^2 + G \cdot x + H \tag{1}$$

wherein x indicates an intake air temperature and E, F, G, and H indicate predetermined coefficients.

Figure 6:
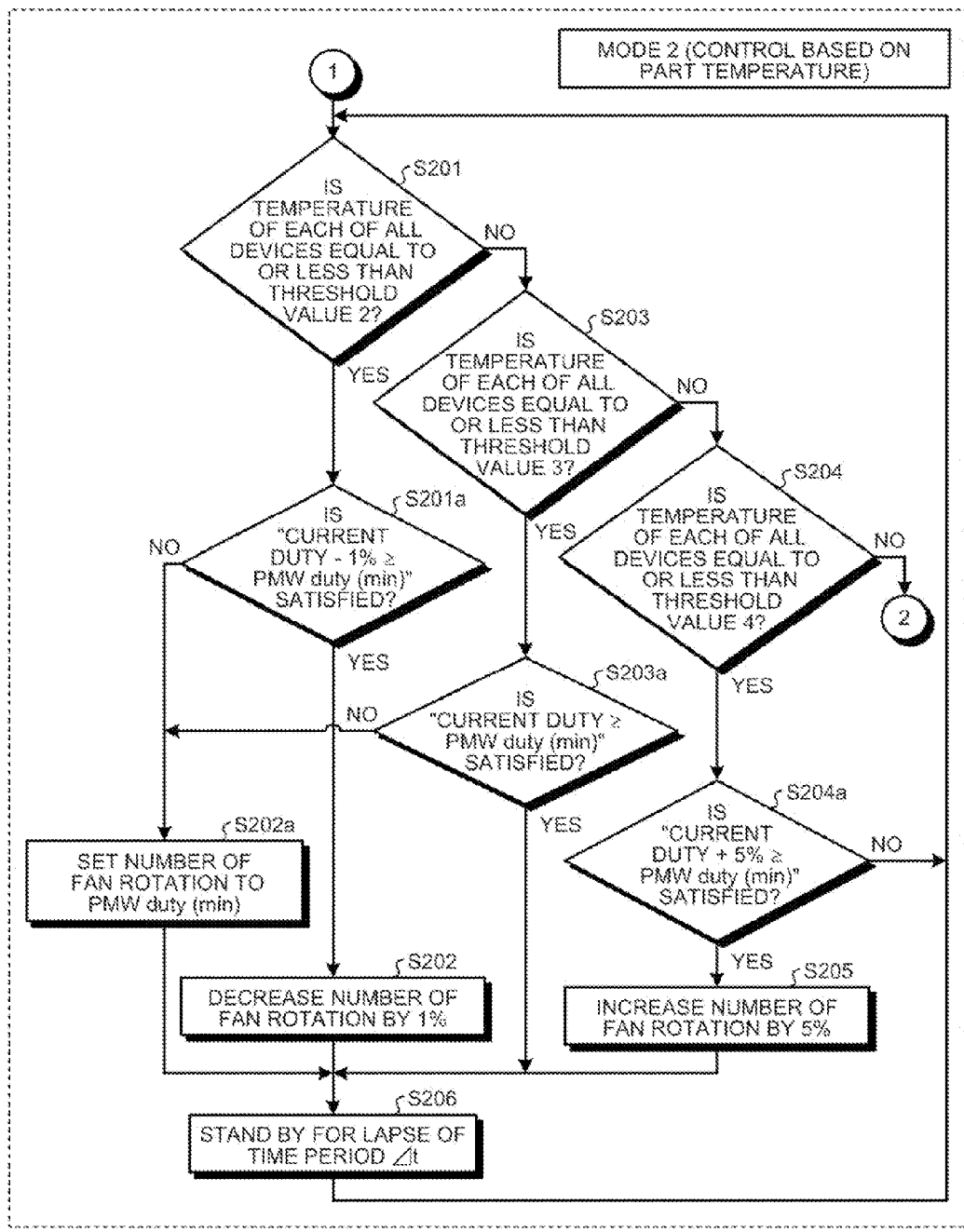
FIG. 6 is a flowchart of a procedure of a cooling fan controlling process (mode 2) according to a third embodiment.

FIG. 6 is a flowchart of a procedure of a cooling fan controlling process (mode 2) according to the third embodiment. In FIG. 6, the same step as that in the flowchart of the procedure of the cooling fan controlling process (mode 2) which is illustrated in FIG. 4B according to the second embodiment is assigned with the same step reference number.

At step S201 in FIG. 6, the fan operation amount increasing/decreasing unit 25c determines whether or not the temperature of each of all the devices is equal to or less than the "threshold value 2" of the part temperature threshold value 25a-2 provided for each device. When each device temperature is determined to be equal to or less than the "threshold value 2" of the part temperature threshold value 25a-2 provided for each device ("Yes" at step S201), the process moves to step S201a. When each device temperature is not determined to be equal to or less than the "threshold value 2" of the part temperature threshold value 25a-2 provided for each device ("No" at step S201), the process moves to step S203.

At step S201a, the fan operation amount increasing/decreasing unit 25c determines whether or not a value obtained by decreasing the current number of rotation of the cooling fans 54b-1 and 54b-2 (hereinafter referred to as "current duty") by 1% is equal to or more than the value "PMW_duty [min]" obtained in Equation (1) above.

When the value obtained by decreasing the "current duty" by 1% is determined to be equal to or more than the value "PMW_duty [min]" obtained in Equation (1) above ("Yes" at step S201a), the process moves to step S202. When the value obtained by decreasing the "current duty" by 1% is not determined to be equal to or more than the value "PMW_duty [min]" obtained in Equation (1) above ("No" at step S201a), the process moves to step S202a.

At step S202a, the fan operation amount increasing/decreasing unit 25c decreases the number of fan rotation determined in the process at step S103, step S105, or step S107 in FIG. 4A by 1%. Besides, at step S202a, the fan operation amount increasing/decreasing unit 25c sets the number of rotation of the cooling fans 54b-1 and 54b-2 to "PMW_duty [min]". On completion of these processes, the process moves to step S206.

At step S203, the fan operation amount increasing/decreasing unit 25c determines whether or not the temperature of each of all the devices is equal to or less than the "threshold value 3" of the part temperature threshold value 25a-2 provided for each device. When each device temperature is determined to be equal to or less than the "threshold value 3" of the part temperature threshold value 25a-2 provided for each device ("Yes" at step S203), the process moves to step S203a. When each device temperature is not determined to be equal to or less than the "threshold value 3" of the part temperature threshold value 25a-2 provided for each device ("No" at step S203), the process moves to step S204.

At step S203a, the fan operation amount increasing/decreasing unit 25c determines whether or not the value for the "current duty" of the cooling fans 54b-1 and 54b-2 is equal to or more than the "PMW_duty [min]" obtained in Equation (1) above.

When the value for the "current duty" is determined to be equal to or more than the "PMW_duty [min]" obtained in Equation (1) above ("Yes" at step S203a), the process moves to step S206. When the value for the "current duty" is not determined to be equal to or more than the "PMW_duty [min]" obtained in Equation (1) above ("No" at step S203a), the process moves to step S202a.

At step S204, the fan operation amount increasing/decreasing unit 25c determines whether or not the temperature of each of all the devices is equal to or less than the "threshold value 4" of the part temperature threshold value 25a-2 provided for each device. When each device temperature is determined to be equal to or less than the "threshold value 4" of the part temperature threshold value 25a-2 provided for each device ("Yes" at step S204), the process moves to step S204a. When each device temperature is not determined to be equal to or less than the "threshold value 4" of the part temperature threshold value 25a-2 provided for each device ("No" at step S204), the process moves to step S101 in FIG. 4A.

At step S204a, the fan operation amount increasing/decreasing unit 25c determines whether or not a value for the number of fan rotation obtained by increasing the "current duty" of the cooling fans 54b-1 and 54b-2 by 5% is equal to or more than the value "PMW_duty [min]" obtained in Equation (1) above.

When the value for the number of fan rotation obtained by increasing the "current duty" by 5% is determined to be equal to or more than the value "PMW_duty [min]" obtained in Equation (1) above ("Yes" at step S204a), the process moves to step S205. When the value for the number of fan rotation obtained by increasing the "current duty" by 5% is not determined to be equal to or more than the value "PMW_duty [min]" obtained in Equation (1) above ("No" at step S204a), the process moves to step S201.

At step S205, the fan operation amount increasing/decreasing unit 25c increases the number of fan rotation determined in the process at step S103, step S105, or step S107 in FIG. 4A by 5%. On completion of this process, the process moves to step S206.

At step S206, the fan operation amount increasing/decreasing unit 25c stands by to a next process till the time period Δt=1 min. passes after starting counting the time period Δt as a second time period. On completion of this process, the process moves to step S201.

Figure 7:
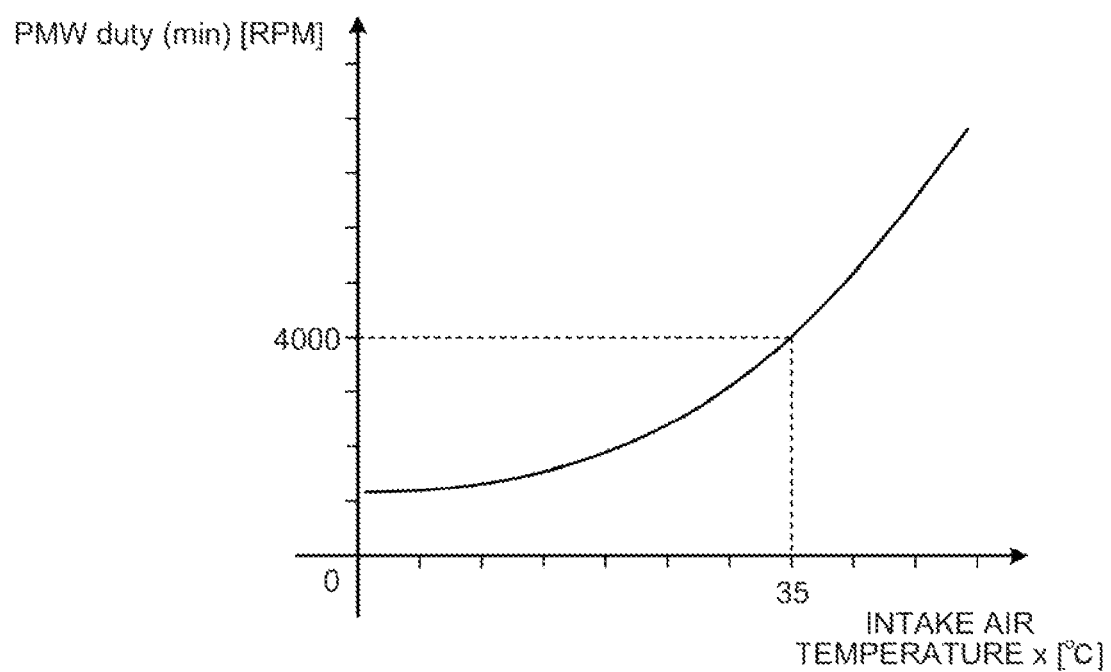
FIG. 7 illustrates minimum number of fan rotation depending on an intake air temperature according to the third embodiment.
Figure 8A:
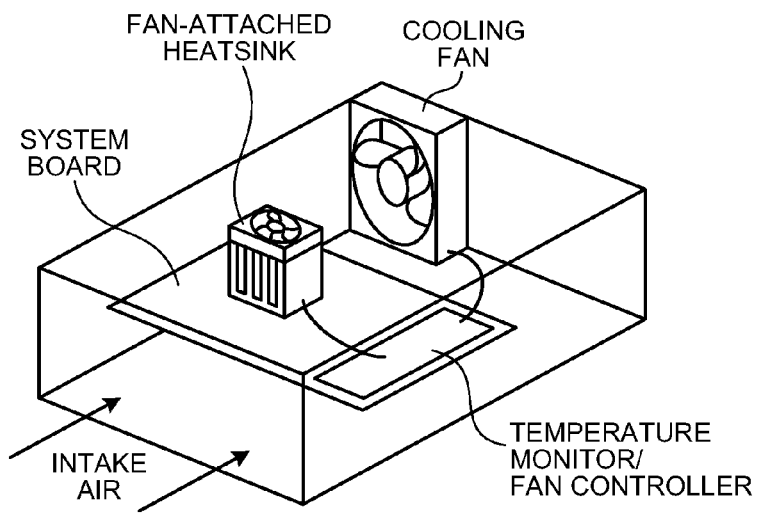
FIG. 8A is a perspective view of an example of a configuration of a conventional personal computer.
Figure 8B:
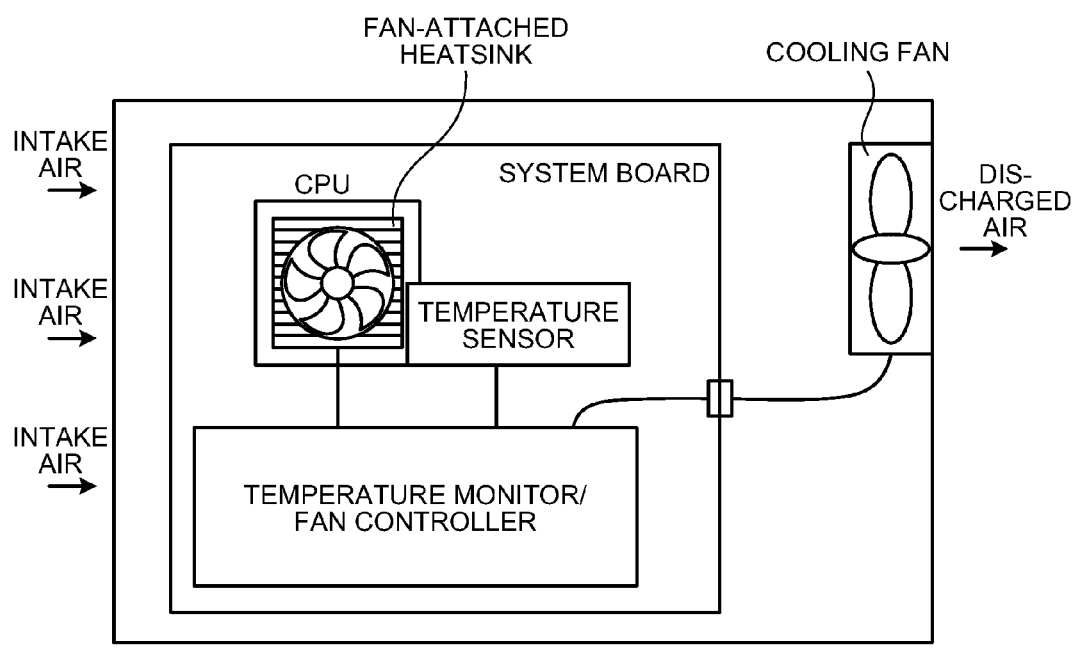
FIG. 8B is a block diagram of the configuration of the conventional personal computer.
Figure 8C:
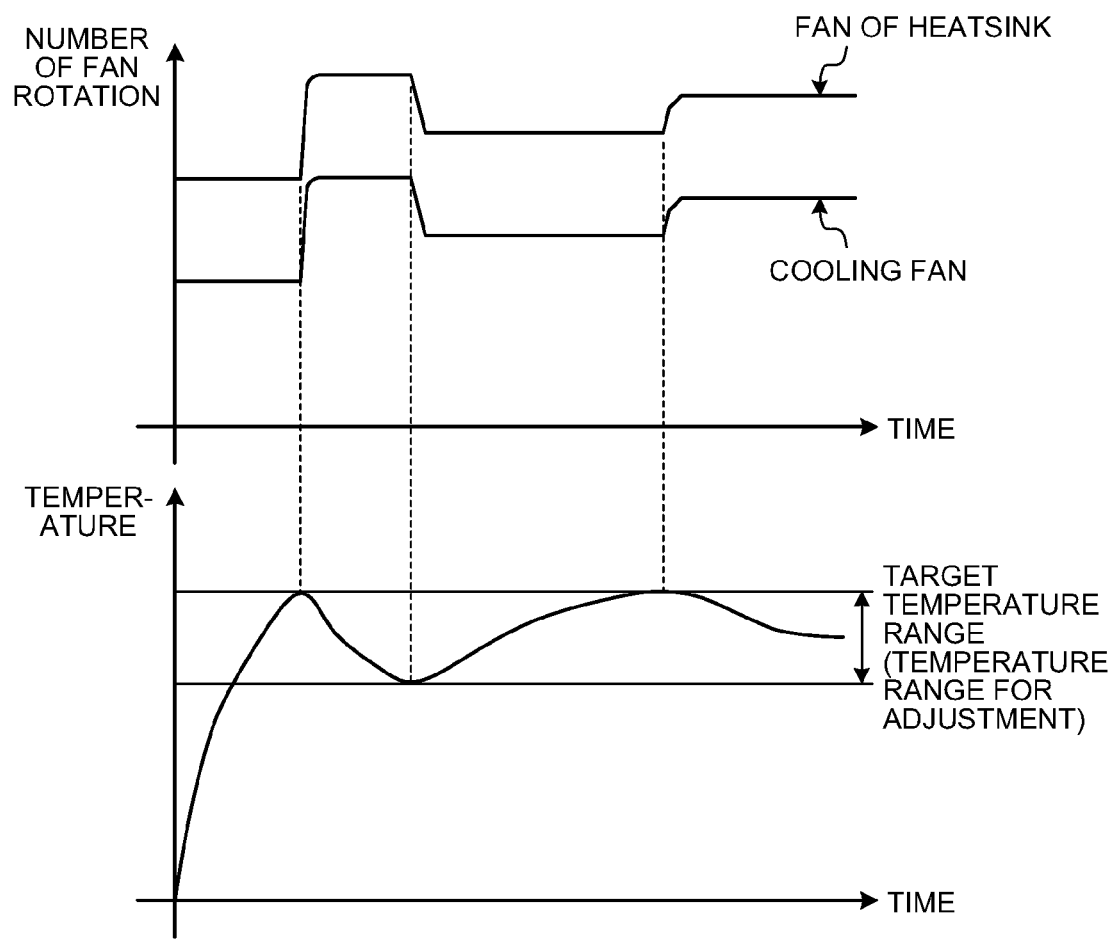
FIG. 8C illustrates a temporal change of a control of the number of fan rotation depending on a CPU temperature in the conventional personal computer.
Figure 9A:
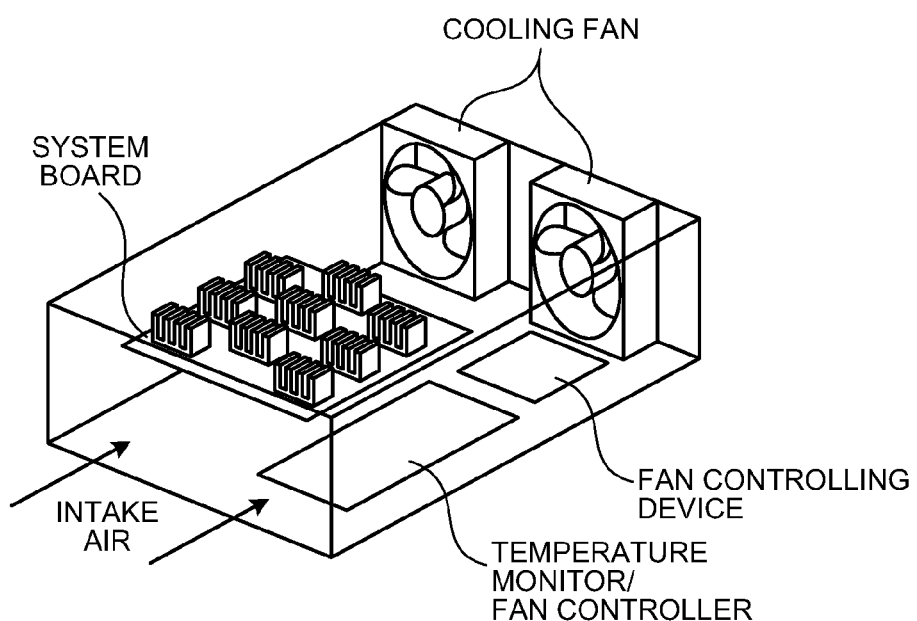
FIG. 9A is a perspective view of an example of a configuration of a conventional server installation.
Figure 9C:
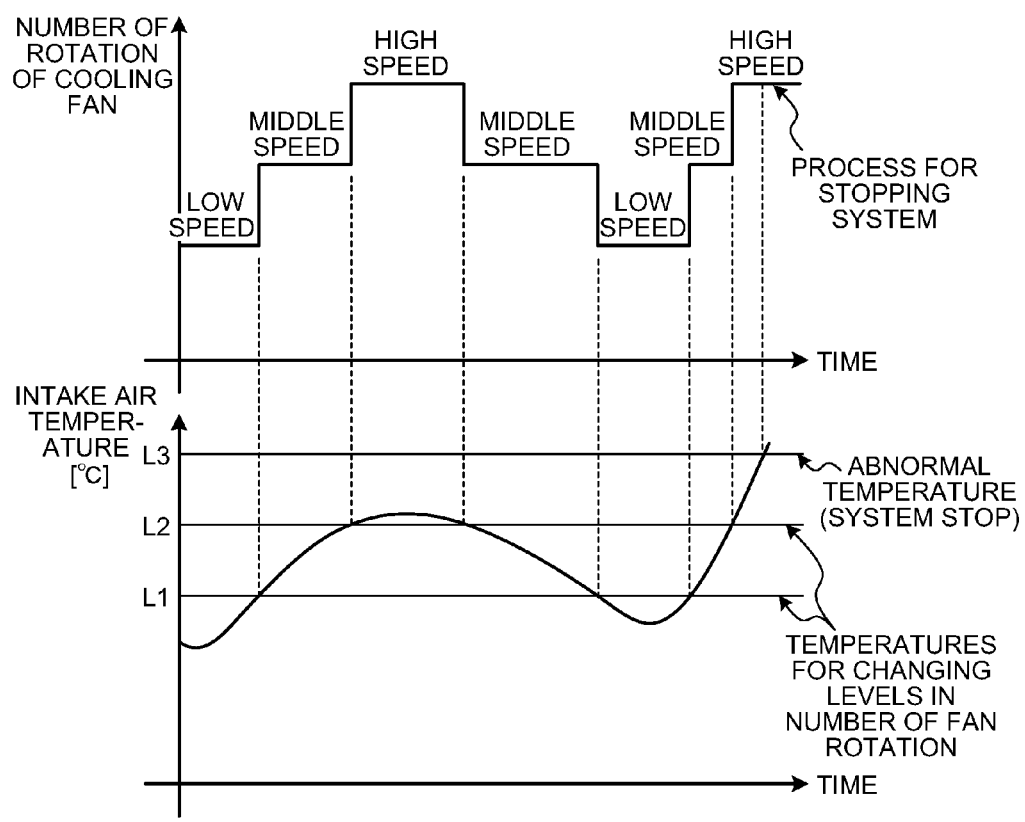
FIG. 9C illustrates a temporal change of a control of the number of fan rotation in the conventional server installation.

The value "PMW_duty [min]" monotonically increases with respect to the intake air temperature x [° C.] as illustrated in FIG. 7. FIG. 7 illustrates minimum number of fan rotation depending on an intake air temperature according to the third embodiment. As illustrated in FIG. 7, when the intake air temperature x is 35° C., the value "PMW_duty [min]" is 4000 [RPM]. Here, the numeral "4000 [RPM]" is provided only as one example and a specific numeral for the "PMW_duty [min]" is determined depending on heat-generation characteristics of a device provided in the server installation 50b.

In the third embodiment, the number of rotation of the cooling fans 54b-1 and 54b-2, r [RPM] determined depending on the intake air temperature x [° C.] is increased or decreased according to the temperature of each device so as not to fall below the minimum value which is determined depending on the intake air temperature x and required as the number of fan rotation. Therefore, the minimum number of fan rotation necessary for cooling a heat generating device provided in the server installation 50b can be secured at any time.

[d] Another Embodiment

While the first to the third embodiments are explained above, the disclosed technique may be realized in different embodiments. Recently, it has been becoming possible to confine a heat generating area or an electronic part which needs to be monitored since an integration of electronic parts has been improved in a server installation having a circuit board such as a system board which mounts a plurality of electronic parts. Therefore, a control of, by monitoring a temperature for each electronic part, the number of rotation of the cooling fan depending on the temperature has been of significance even with a cost for providing a temperature sensor for each electronic part and monitoring the temperature of each electronic part.

Hence, a monitor area including a heat generating part temperature of which needs to be monitored is set in a circuit board in a server installation. Then, a temperature sensor such as a semiconductor temperature sensor and a thermistor is provided at a leeward side of each monitor area involved in a flow path of cooling air formed by each cooling fan. Then, the number of rotation of the cooling fan forming the flow path of the cooling air may be controlled depending on the temperature detected by the corresponding temperature sensor of each monitor area. This configuration allows controlling the number of fan rotation more carefully for each cooling fan depending on the temperature of each monitor area.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A cooling controlling apparatus that cools an electronic apparatus, comprising:
   a cooling fan that discharges air in an inside of the electronic apparatus to an outside of the electronic apparatus;
   an intake air temperature detector that detects a temperature of air taken into the electronic apparatus by the cooling fan;
   a part temperature detector that detects a temperature of each of a plurality of electronic parts arranged inside the electronic apparatus;
   a threshold value storing unit that stores an intake air temperature threshold value and a plurality of part temperature threshold values each provided for each of the plurality of electronic parts, respectively; and
   a fan controller having first and second modes and that controls a rotation number of the cooling fan based on a result of comparing the intake air temperature detected by the intake air temperature detector and the stored intake air temperature threshold value when the fan controller is in a first mode,
   that performs at least one of increasing and decreasing the rotation number of the cooling fan using a predetermined variation ratio by detecting whether or not the temperature detected by the part temperature detector is equal to or less than each of the plurality of part temperature threshold values provided for each of the plurality of electronic parts, when the temperature of each of the plurality of electronic parts is in a predetermined condition and the fan controller is in a second mode, and
   that stands by to progress to a next process for a first time period after performing one of the increasing or the decreasing the rotation number.

2. The cooling controlling apparatus according to claim 1, wherein
   the plurality of stored part temperature threshold values provided for each of the plurality of electronic parts each include a first threshold value and a second threshold value larger than the first threshold value for each of the plurality of electronic parts, respectively, and
   the fan controller compares the detected temperature of each of the plurality of electronic parts and each of the plurality of first threshold values provided for each of the electronic parts in the first mode, changes the first mode to the second mode when all the temperatures of the plurality of electronic parts are equal to or smaller than each of the plurality of first threshold values provided for each of the electronic parts, compares the detected temperature of each of the plurality of electronic parts and each of the plurality of second threshold values provided for each of the electronic parts, and decreases the rotation number of the cooling fan controlled based on the intake air temperature by a first variation ratio when all of the temperatures of the plurality of electronic parts are equal to or smaller than each of the plurality of second threshold values.

3. The cooling controlling apparatus according to claim 2, wherein the fan controller calculates a minimum rotation number of the cooling fan based on the detected intake air temperature, decreases the rotation number of the cooling fan by the first variation ratio when the rotation number of the cooling fan obtained by decreasing by the first variation ratio is equal to or larger than the minimum rotation number, and controls the rotation number of the cooling fan to be the minimum rotation number when the rotation number obtained by decreasing by the first variation ratio is smaller than the minimum rotation number.

4. The cooling controlling apparatus according to claim 2, wherein the plurality of stored part temperature threshold values provided for each of the plurality of electronic parts each include a third threshold value larger than the second threshold value for each of the electronic parts, and the fan controller compares the detected temperature of each of the plurality of electronic parts and each of the plurality of third threshold values provided for each of the electronic parts in the second mode when the detected temperature of each of the plurality of electronic parts is not equal to or smaller than the second threshold value, and maintains the rotation number when all the temperatures of the plurality of electronic parts are equal to or smaller than each of the plurality of third threshold values.

5. The cooling controlling apparatus according to claim 4, wherein the plurality of stored part temperature threshold values provided for each of the plurality of electronic parts each include a fourth threshold value larger than the third threshold value for each of the electronic parts, and the fan controller further compares the detected temperature of each of the plurality of electronic parts and each of the fourth threshold values provided for each of the electronic parts in the second mode when the detected temperature of each of the plurality of electronic parts is not equal to or smaller than the third threshold value, and increases the rotation number by a second variation ratio when all the temperatures of the electronic parts are equal to or smaller than each of the plurality of fourth threshold values.

6. The cooling controlling apparatus according to claim 5, wherein the fan controller calculates a minimum rotation number of the cooling fan based on the detected intake air temperature, increases the rotation number of the cooling fan by the second variation ratio when a second rotation number of the cooling fan obtained by increasing the rotation number of the cooling fan by the second variation ratio is equal to or larger than the minimum rotation number of the cooling fan, and does not increase the rotation number of the cooling fan when the second rotation number is smaller than the minimum rotation number of the cooling fan.

7. The cooling controlling apparatus according to claim 6, wherein the fan controller stands by to progress to a next process for a second time period after performing one of the maintaining the rotation number, decreasing the rotation number of the cooling fan by the first variation ratio, and one of increasing and decreasing the rotation number of the cooling fan by the second variation ratio.

8. The cooling controlling apparatus according to claim 7, wherein a first time period is larger than the second time period.

9. The cooling controlling apparatus according to claim 5, wherein the fan controller controls a rotation number based on a result of comparing an intake air temperature newly detected by the intake air temperature detector and the stored intake air temperature threshold value when all the temperatures of the plurality of electronic parts are not equal to or smaller than each of the plurality of fourth threshold values.

10. The cooling controlling apparatus according to claim 5, wherein a first variation ratio is small than the second variation ratio.

11. The cooling controlling apparatus according to claim 1, wherein the fan controller stops an operation of the electronic apparatus when the intake air temperature is more than a predetermined value.

12. An electronic apparatus, comprising:

a plurality of electronic parts arranged in an inside of the electronic apparatus;

a cooling fan that discharges air in the inside of the electronic apparatus to an outside of the electronic apparatus;

an intake air temperature detector that detects a temperature of air taken into the electronic apparatus by the cooling fan;

a part temperature detector that detects a temperature of each of the electronic parts;

a threshold value storing unit that stores an intake air temperature threshold value and a plurality of part temperature threshold values each provided for each of a plurality of electronic parts, respectively; and a fan controller having first and second modes and that controls a rotation number of the cooling fan based on a result of comparing the intake air temperature detected by the intake air temperature detector and the stored intake air temperature threshold value when the fan controller is in a first mode, that performs at least one of increasing and decreasing the rotation number of the cooling fan using a predetermined variation ratio by detecting whether or not the temperature detected by the part temperature detector is equal to or less than each of the plurality of part temperature threshold values provided for each of the plurality of electronic parts, when the temperature of each of the plurality of electronic parts is in a predetermined condition and the fan controller is in a second mode, and that stands by to progress to a next process for a first time period after performing one of the increasing or the decreasing the rotation number.

13. A cooling controlling method performed by a cooling controlling apparatus that cools an electronic apparatus, the cooling controlling method comprising:

storing an intake air temperature threshold value and a plurality of part temperature threshold values each provided for each of a plurality of electronic parts arranged inside the electronic apparatus, respectively, in a threshold value storing unit;

detecting a temperature of each of the plurality of the electronic parts using a part temperature detector;

detecting a temperature of air taken into the electronic apparatus using an intake air temperature detector;

using a fan controller having first and second modes and controlling a rotation number of a cooling fan based on a result of comparing the intake air temperature detected by the intake air temperature detector and the stored intake air temperature threshold value when the fan controller is in the first mode;

performing at least one of increasing and decreasing the rotation number of the cooling fan using a predetermined variation ratio by detecting whether or not the temperature detected by the part temperature detector is equal to or less than each of the plurality of part temperature threshold values provided for each of the plurality of electronic parts, when the temperature of each of the plurality electronic parts is in a predetermined condition and the fan controller is in the second mode; and standing by to progress to a next process for a first time period after performing one of the increasing or the decreasing the rotation number.

14. The cooling controlling method according to claim 13, wherein
the plurality of part temperature threshold values provided for each of the plurality of electronic parts each include a first threshold value and a second threshold value larger than the first threshold value for each of the plurality of electronic parts, respectively, and
the controlling includes
comparing the detected temperature of each of the plurality of electronic parts and each of the first threshold values provided for each of the electronic parts in the first mode;
changing the first mode to the second mode when all of the temperatures of the plurality of electronic parts are equal to or smaller than each of the plurality of first threshold values provided for each of the electronic parts;
comparing the detected temperature of each of the plurality of electronic parts and each of the plurality of second threshold values provided for each of the electronic parts; and
decreasing the rotation number of the cooling fan controlled based on the intake air temperature by a first variation ratio when all of the temperatures of the plurality of electronic parts are equal to or smaller than each of the plurality of second threshold values.

15. The cooling controlling method according to claim 14, wherein
the plurality of part temperature threshold values provided for each of the plurality of electronic parts each include a third threshold value larger than the second threshold value for each of the electronic parts, and
the controlling includes
comparing the detected temperature of each of the plurality of electronic parts and each of the plurality of third threshold values provided for each of the electronic parts in the second mode when the detected temperature of each of the plurality of electronic parts is not equal to or smaller than the second threshold value; and
maintaining the rotation number of the cooling fan when all the temperatures of the plurality of electronic parts are equal to or smaller than each of the plurality of third threshold values.

16. The cooling controlling method according to claim 15, wherein
the plurality of part temperature threshold values provided for each of the plurality of electronic parts each include a fourth threshold value larger than the third threshold value for each of the electronic parts, and
the controlling includes
further comparing the detected temperature of each of the plurality of electronic parts and each of the fourth threshold values provided for each of the electronic parts in the second mode when the detected temperature of each of the plurality of electronic parts is not equal to or smaller than the third threshold value; and
increasing the rotation number of by a second variation ratio when all the temperatures of the electronic parts are equal to or smaller than the fourth threshold values.

17. The cooling controlling method according to claim 16, wherein, the controlling includes controlling a rotation number based on a result of comparing an intake air temperature newly detected at the detecting of the intake air temperature and the stored intake air temperature threshold value when all the temperatures of the electronic parts are not equal to or smaller than the fourth threshold values.

* * * * *